US011138939B2

(12) United States Patent
Zhang

(10) Patent No.: US 11,138,939 B2
(45) Date of Patent: Oct. 5, 2021

(54) GATE DRIVER ON ARRAY (GOA) CIRCUIT AND DISPLAY APPARATUS

(71) Applicant: Shenzhen China Star Optoelectronics Semiconductor Display Technology Co., Ltd., Guangdong (CN)

(72) Inventor: Liuqi Zhang, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 16/980,907

(22) PCT Filed: May 9, 2019

(86) PCT No.: PCT/CN2019/086230
§ 371 (c)(1),
(2) Date: Sep. 15, 2020

(87) PCT Pub. No.: WO2020/206792
PCT Pub. Date: Oct. 15, 2020

(65) Prior Publication Data
US 2021/0158761 A1    May 27, 2021

(30) Foreign Application Priority Data
Apr. 10, 2019 (CN) .......................... 201910283268.3

(51) Int. Cl.
*G09G 3/3266* (2016.01)

(52) U.S. Cl.
CPC ... *G09G 3/3266* (2013.01); *G09G 2300/0408* (2013.01); *G09G 2310/08* (2013.01)

(58) Field of Classification Search
CPC .... G06F 3/3677; G06F 3/3648; G06F 3/3266; G09G 2300/0426; G09G 2310/0286; G09G 2310/0267; G09G 2310/08; G09G 2310/0283; G11C 19/287; G11C 19/28
See application file for complete search history.

(56) References Cited

U.S. PATENT DOCUMENTS

| 10,950,155 B1* | 3/2021 | Xue ..................... G11C 19/28 |
| 2016/0267864 A1* | 9/2016 | Xiao .................... G09G 3/3677 |
| 2016/0343335 A1* | 11/2016 | Cao ..................... G09G 3/36 |
| 2021/0225253 A1* | 7/2021 | Li ....................... G11C 19/28 |

* cited by examiner

*Primary Examiner* — Nitin Patel
*Assistant Examiner* — Amen W. Bogale

(57) ABSTRACT

Embodiments of the application provide a gate driver on array (GOA) circuit and display apparatus, which is capable of outputting signals of positive and negative pulse waveforms using a simplified circuit design.

20 Claims, 5 Drawing Sheets

US 11,138,939 B2

GATE DRIVER ON ARRAY (GOA) CIRCUIT AND DISPLAY APPARATUS

RELATED APPLICATIONS

This application is a National Phase of PCT Patent Application No. PCT/CN2019/086230 having International filing date of May 9, 2019, which claims the benefit of priority of Chinese Patent Application No. 201910283268.3 filed on Apr. 10, 2019. The contents of the above applications are all incorporated by reference as if fully set forth herein in their entirety.

FIELD AND BACKGROUND OF THE INVENTION

The present invention relates to a technical field of display technologies, and more particularly, to a gate driver on array (GOA) circuit and display apparatus.

Gate driver on array (GOA) is a technique that integrates a gate driving circuit unto an array substrate of a display panel, to substitute for a gate driving integrated circuit (IC), so as to reduce the cost from material and production process aspects.

In an organic light-emitting diode (OLED) display panel, a GOA circuit requires two signal output pulse waveforms: one is positive pulse waveforms, which can be generated from a conventional GOA circuit, and the other is negative pulse waveforms. However, design complexity hikes with increasing function demands of generating negative pulse waveforms for existing GOA circuits.

SUMMARY OF THE INVENTION

Technical Problems

An objective of the invention is to provide a gate driver on array (GOA) circuit and display apparatus to ameliorate the problem of design complexity for providing negative pulse waveform generation capability to GOA circuit.

Technical Solutions

An embodiment of the application provides a gate driver on array (GOA) circuit, comprising a multi-stage cascade of GOA units, each of which includes an input module, a first output module, a second output module, a pull-down module, an inversion module, a clamping module, and a bootstrap capacitor.

The input module is fed with a first clock signal and a prior stage transmitted signal, and is electrically connected to a first node and a second node, wherein the input module outputs the prior stage transmitted signal to the first node under control of the first clock signal.

The first output module is fed with a second clock signal and is electrically connected to the first node, wherein the first output module outputs a current stage transmitted signal under control by voltage level of the first node.

The second output module is fed with a third reference low voltage signal and is electrically connected to the first node, wherein the second output module outputs a current stage scanning signal under control by voltage level of the first node.

The pull-down module is fed with a next stage transmitted signal, a first reference low level signal and a second reference low level signal, and is electrically connected with the first node and the current stage transmitted signal, wherein the pull-down module pulls the voltage level of the first node down to the voltage level of the first reference low level signal, and pull the voltage level of the current stage transmitted signal down to the second reference low level signal under the control of the next stage transmitted signal.

The inversion module is fed with a reference high level signal and the first reference low level signal, and is electrically connected to a third node and the first node, wherein the inversion module controls a voltage level of the third node according to the reference high level signal, the first reference low level signal and the voltage level of the first node.

The clamping module is fed with the first reference low level signal, the reference high level signal, and the second reference low level signal, and is electrically connected to the first node, the third node, the current stage transmitted signal, and the current stage scanning signal, wherein the clamping module under control of the voltage level of the third node, keeps the voltage level of the first node and a voltage level of the current stage transmitted signal at a voltage level of the first reference low level signal, and a voltage level of the current stage scanning signal at a voltage level of the reference high level signal.

One terminal of the bootstrap capacitor is electrically connected to the first node, and the other terminal of the bootstrap capacitor is electrically connected to the current stage transmitted signal.

The current stage transmitted signal is a positive pulse signal, and the current stage scanning signal is a negative pulse signal.

The GOA circuit further comprises: a 17th transistor, a 18th transistor, and a 19th transistor.

A gate terminal of the 17th transistor is electrically connected to the current stage transmitted signal, and a drain terminal of the 17th transistor is electrically connected to the second node, a source terminal of the 17th transistor is electrically connected to a drain terminal of the 18th transistor and a drain terminal of the 19th transistor, a gate terminal of the 18th transistor is electrically connected to the first node, and a source terminal of the 18th transistor is electrically connected to the second clock signal, and a gate terminal of the 19th transistor is electrically connected to the third node, and a source terminal of the 19th transistor is electrically connected to the second reference low level signal.

The voltage level of the first reference low level signal is lower than the voltage level of the second reference low level signal, and the voltage level of the second reference level signal is equal to the voltage level of the third reference low level signal.

In the GOA circuit of the application, the input module comprises a second transistor and a third transistor, a gate terminal of the second transistor and a gate terminal of the third transistor are electrically connected to the first clock signal, and a source terminal of the second transistor is electrically connected to the prior stage transmitted signal, and a drain terminal of the second transistor and a source terminal of the third transistor are electrically connected with the second node, and a drain terminal of the third transistor is electrically connected to the first node.

In the GOA circuit of the application, the first output module comprises a fourth transistor, a gate terminal of the fourth transistor is electrically connected to the first node, and a source terminal of the fourth transistor is electrically connected to the second clock signal, and a drain terminal of the fourth transistor is electrically connected to the current stage transmitted signal.

In the GOA circuit of the application, wherein the second output module comprises a fifth transistor, a gate terminal of the fifth transistor is electrically connected to the first node, and a source terminal of the fifth transistor is electrically connected to the third reference low voltage signal, and a drain terminal of the fifth transistor is electrically connected to the current stage scanning signal.

In the GOA circuit of the application, the pull-down module comprises a sixth transistor, a seventh transistor and an eighth transistor, a gate terminal of the sixth transistor, a gate terminal of the seventh transistor and a gate terminal of the eighth transistor are electrically connected to the next stage transmitted signal, and a source terminal power of the sixth transistor is electrically connected to the second reference low level signal, and a drain terminal of the sixth transistor is electrically connected to the current stage transmitted signal, a drain terminal of the seventh transistor is electrically connected to the first node, and a source terminal of the seventh transistor is connected with a drain terminal of the eighth transistor, and a source terminal of the eighth transistor is electrically connected to the first reference low level signal.

In the GOA circuit of the application, the inversion module comprises a ninth transistor, a tenth transistor, a eleventh transistor, and an 12th transistor, a gate terminal and a source terminal of the ninth transistor and a source polar of the eleventh transistor are electrically connected to the reference high level signal, a drain terminal of the ninth transistor is electrically connected to a gate terminal of the eleventh transistor and a drain terminal of the tenth transistor, a drain terminal of the eleventh transistor and a drain terminal of the 12th transistor are electrically connected to the third node, and a gate terminal of the tenth transistor and a gate terminal of the 12th transistor are electrically connected to the first node, a source terminal of the tenth transistor and a source terminal of the 12th transistor are electrically connected to the first reference low level signal.

In the GOA circuit of the application, the clamping module comprises a 13th transistor, a 14th transistor, a 15th transistor, and an 16th transistor, a gate terminal of the 13th transistor, a gate terminal of the 14th transistor, a gate terminal of the 15th transistor, and a gate terminal of the 16th transistor are electrically connected to the third node, and a source terminal of the 13th transistor is electrically connected to the reference high level signal, a drain terminal of the 13th transistor is electrically connected to the current stage scanning signal, and a source terminal of the 14th transistor is electrically connected to the second reference low level signal, a drain terminal of the 14th transistor is electrically connected to the current stage transmitted signal, and a drain terminal of the 16th transistor is connected with a source terminal of the 15th transistor, a drain terminal of the 15th transistor is electrically connected to the first node, and a source terminal of the 16th transistor is electrically connected to the first reference low level signal.

An embodiment of the application provides a gate driver on array (GOA) circuit, comprising a multi-stage cascade of GOA units, each of which includes an input module, a first output module, a second output module, a pull-down module, an inversion module, a clamping module, and a bootstrap capacitor.

The input module is fed with a first clock signal and a prior stage transmitted signal, and is electrically connected to a first node and a second node, wherein the input module outputs the prior stage transmitted signal to the first node under control of the first clock signal.

The first output module is fed with a second clock signal and is electrically connected to the first node, wherein the first output module outputs a current stage transmitted signal under control by voltage level of the first node.

The second output module is fed with a third reference low voltage signal and is electrically connected to the first node, wherein the second output module outputs a current stage scanning signal under control by voltage level of the first node.

The pull-down module is fed with a next stage transmitted signal, a first reference low level signal and a second reference low level signal, and is electrically connected with the first node and the current stage transmitted signal, wherein the pull-down module pulls the voltage level of the first node down to the voltage level of the first reference low level signal, and pull the voltage level of the current stage transmitted signal down to the second reference low level signal under the control of the next stage transmitted signal.

The inversion module is fed with a reference high level signal and the first reference low level signal, and is electrically connected to a third node and the first node, wherein the inversion module controls a voltage level of the third node according to the reference high level signal, the first reference low level signal and the voltage level of the first node.

The clamping module is fed with the first reference low level signal, the reference high level signal, and the second reference low level signal, and is electrically connected to the first node, the third node, the current stage transmitted signal, and the current stage scanning signal, wherein the clamping module under control of the voltage level of the third node, keeps the voltage level of the first node and a voltage level of the current stage transmitted signal at a voltage level of the first reference low level signal, and a voltage level of the current stage scanning signal at a voltage level of the reference high level signal.

One terminal of the bootstrap capacitor is electrically connected to the first node, and the other terminal of the bootstrap capacitor is electrically connected to the current stage transmitted signal.

The current stage transmitted signal is a positive pulse signal, and the current stage scanning signal is a negative pulse signal.

In the GOA circuit of the application, the input module comprises a second transistor and a third transistor, a gate terminal of the second transistor and a gate terminal of the third transistor are electrically connected to the first clock signal, and a source terminal of the second transistor is electrically connected to the prior stage transmitted signal, and a drain terminal of the second transistor and a source terminal of the third transistor are electrically connected with the second node, and a drain terminal of the third transistor is electrically connected to the first node.

In the GOA circuit of the application, the first output module comprises a fourth transistor, a gate terminal of the fourth transistor is electrically connected to the first node, and a source terminal of the fourth transistor is electrically connected to the second clock signal, and a drain terminal of the fourth transistor is electrically connected to the current stage transmitted signal.

In the GOA circuit of the application, the second output module comprises a fifth transistor, a gate terminal of the fifth transistor is electrically connected to the first node, and a source terminal of the fifth transistor is electrically connected to the third reference low voltage signal, and a drain terminal of the fifth transistor is electrically connected to the current stage scanning signal.

In the GOA circuit of the application, the pull-down module comprises a sixth transistor, a seventh transistor and an eighth transistor, a gate terminal of the sixth transistor, a gate terminal of the seventh transistor and a gate terminal of the eighth transistor are electrically connected to the next stage transmitted signal, and a source terminal power of the sixth transistor is electrically connected to the second reference low level signal, and a drain terminal of the sixth transistor is electrically connected to the current stage transmitted signal, a drain terminal of the seventh transistor is electrically connected to the first node, and a source terminal of the seventh transistor is connected with a drain terminal of the eighth transistor, and a source terminal of the eighth transistor is electrically connected to the first reference low level signal.

In the GOA circuit of the application, the inversion module comprises a ninth transistor, a tenth transistor, a eleventh transistor, and an 12th transistor, a gate terminal and a source terminal of the ninth transistor and a source polar of the eleventh transistor are electrically connected to the reference high level signal, a drain terminal of the ninth transistor is electrically connected to a gate terminal of the eleventh transistor and a drain terminal of the tenth transistor, a drain terminal of the eleventh transistor and a drain terminal of the 12th transistor are electrically connected to the third node, and a gate terminal of the tenth transistor and a gate terminal of the 12th transistor are electrically connected to the first node, a source terminal of the tenth transistor and a source terminal of the 12th transistor are electrically connected to the first reference low level signal.

In the GOA circuit of the application, the clamping module comprises a 13th transistor, a 14th transistor, a 15th transistor, and an 16th transistor, a gate terminal of the 13th transistor, a gate terminal of the 14th transistor, a gate terminal of the 15th transistor, and a gate terminal of the 16th transistor are electrically connected to the third node, and a source terminal of the 13th transistor is electrically connected to the reference high level signal, a drain terminal of the 13th transistor is electrically connected to the current stage scanning signal, and a source terminal of the 14th transistor is electrically connected to the second reference low level signal, a drain terminal of the 14th transistor is electrically connected to the current stage transmitted signal, and a drain terminal of the 16th transistor is connected with a source terminal of the 15th transistor, a drain terminal of the 15th transistor is electrically connected to the first node, and a source terminal of the 16th transistor is electrically connected to the first reference low level signal.

In the GOA circuit of the application, the GOA circuit further comprises: a 17th transistor, a 18th transistor, and a 19th transistor, a gate terminal of the 17th transistor is electrically connected to the current stage transmitted signal, and a drain terminal of the 17th transistor is electrically connected to the second node, a source terminal of the 17th transistor is electrically connected to a drain terminal of the 18th transistor and a drain terminal of the 19th transistor, a gate terminal of the 18th transistor is electrically connected to the first node, and a source terminal of the 18th transistor is electrically connected to the second clock signal, and a gate terminal of the 19th transistor is electrically connected to the third node, and a source terminal of the 19th transistor is electrically connected to the second reference low level signal.

In the GOA circuit of the application, the voltage level of the first reference low level signal is lower than the voltage level of the second reference low level signal, and the voltage level of the second reference level signal is equal to the voltage level of the third reference low level signal.

An embodiment of the application provides a display apparatus including a gate driver on array (GOA) circuit. The GOA circuit comprises a multi-stage cascade of GOA units, each of which includes an input module, a first output module, a second output module, a pull-down module, an inversion module, a clamping module, and a bootstrap capacitor. The input module is fed with a first clock signal and a prior stage transmitted signal, and is electrically connected to a first node and a second node, wherein the input module outputs the prior stage transmitted signal to the first node under control of the first clock signal. The first output module is fed with a second clock signal and is electrically connected to the first node, wherein the first output module outputs a current stage transmitted signal under control by voltage level of the first node. The second output module is fed with a third reference low voltage signal and is electrically connected to the first node, wherein the second output module outputs a current stage scanning signal under control by voltage level of the first node. The pull-down module is fed with a next stage transmitted signal, a first reference low level signal and a second reference low level signal, and is electrically connected with the first node and the current stage transmitted signal, wherein the pull-down module pulls the voltage level of the first node down to the voltage level of the first reference low level signal, and pull the voltage level of the current stage transmitted signal down to the second reference low level signal under the control of the next stage transmitted signal. The inversion module is fed with a reference high level signal and the first reference low level signal, and is electrically connected to a third node and the first node, wherein the inversion module controls a voltage level of the third node according to the reference high level signal, the first reference low level signal and the voltage level of the first node. The clamping module is fed with the first reference low level signal, the reference high level signal, and the second reference low level signal, and is electrically connected to the first node, the third node, the current stage transmitted signal, and the current stage scanning signal, wherein the clamping module under control of the voltage level of the third node, keeps the voltage level of the first node and a voltage level of the current stage transmitted signal at a voltage level of the first reference low level signal, and a voltage level of the current stage scanning signal at a voltage level of the reference high level signal.

One terminal of the bootstrap capacitor is electrically connected to the first node, and the other terminal of the bootstrap capacitor is electrically connected to the current stage transmitted signal.

The current stage transmitted signal is a positive pulse signal, and the current stage scanning signal is a negative pulse signal.

In the display apparatus of the application, the input module comprises a second transistor and a third transistor, a gate terminal of the second transistor and a gate terminal of the third transistor are electrically connected to the first clock signal, and a source terminal of the second transistor is electrically connected to the prior stage transmitted signal, and a drain terminal of the second transistor and a source terminal of the third transistor are electrically connected with the second node, and a drain terminal of the third transistor is electrically connected to the first node.

In the display apparatus of the application, the first output module comprises a fourth transistor, a gate terminal of the fourth transistor is electrically connected to the first node, and a source terminal of the fourth transistor is electrically connected to the second clock signal, and a drain terminal of the fourth transistor is electrically connected to the current stage transmitted signal.

In the display apparatus of the application, the second output module comprises a fifth transistor, a gate terminal of the fifth transistor is electrically connected to the first node, and a source terminal of the fifth transistor is electrically connected to the third reference low voltage signal, and a drain terminal of the fourth transistor is electrically connected to the current stage scanning signal.

Useful Effects

Embodiments of the application provide a GOA circuit and display apparatus, which is capable of outputting signals of positive and negative pulse waveforms using simplified circuit design.

BRIEF DESCRIPTION OF THE SEVERAL VIEWS OF THE DRAWINGS

To clear disclose the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DESCRIPTION OF SPECIFIC EMBODIMENTS OF THE INVENTION

Figure 1:
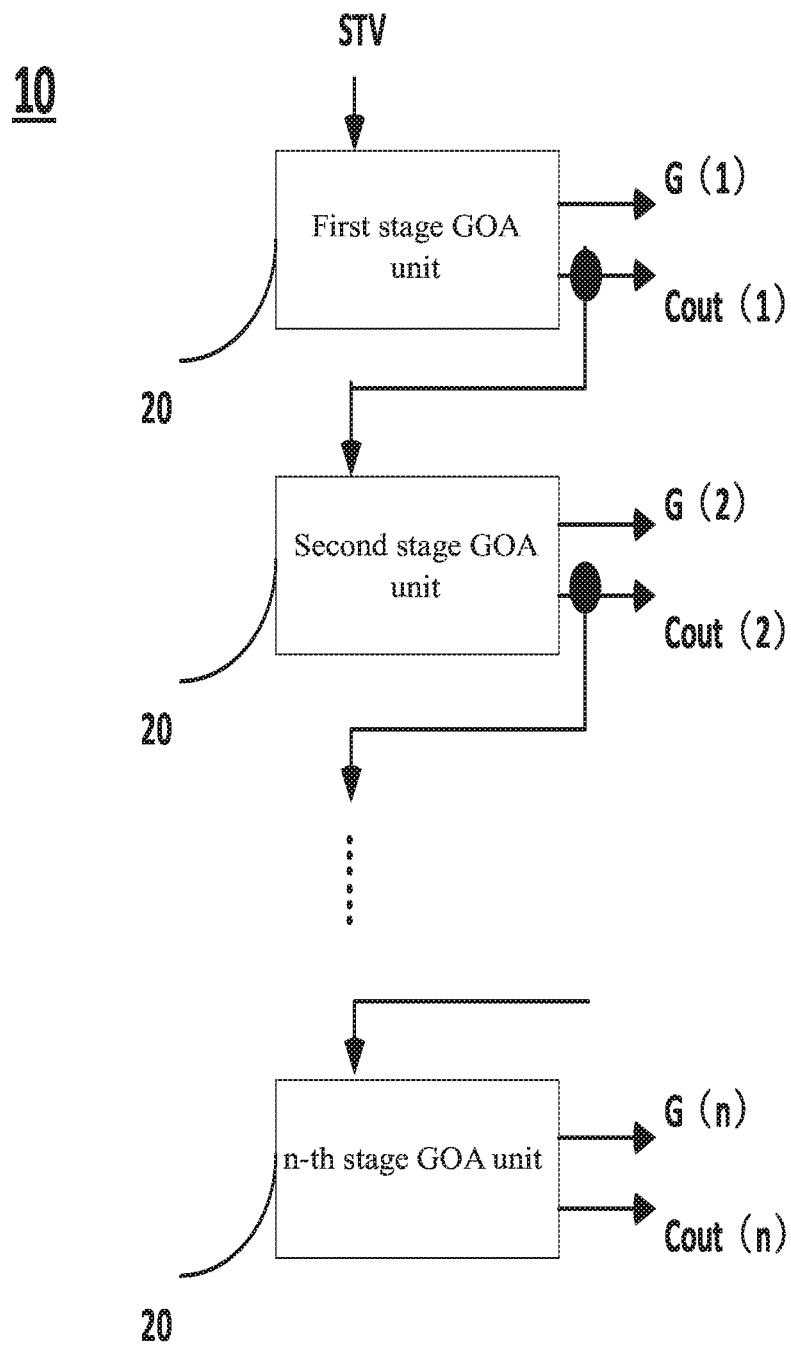
FIG. 1 is a schematic view showing architecture of a gate driver on array (GOA) circuit of an embodiment of the invention.

The following is a clear and comprehensive description of the technical solutions in the embodiments of this application with reference to the drawings in the embodiments of the application. Obviously, the embodiments described are only part of this application, not for exhaustive illustration. Based on the embodiments of the application, other embodiments which may be easily obtained by those having ordinary skills in the art without paying additional creative effort fall within the scope of this application for protection.

A transistor used in embodiments of the application may be a thin film transistor, a field effect transistor (FET) or a device with similar characteristics. A source and a drain terminal of a transistor are symmetrical, and thus interchangeable. In the embodiments of the application, to distinguish the other two terminals of a transistor besides gate terminal, one is referred to as a source terminal, and the other is referred to as a drain terminal. According to the shape convention in the drawings, a middle end of a transistor is a gate terminal, an end for signal input is a source terminal, and an end for signal output is a drain terminal. In addition, transistors used in the embodiment of the application are n-type transistors, which is turned on when the gate terminal is in high level and turned off when the gate terminal is in a low level.

Figure 2:
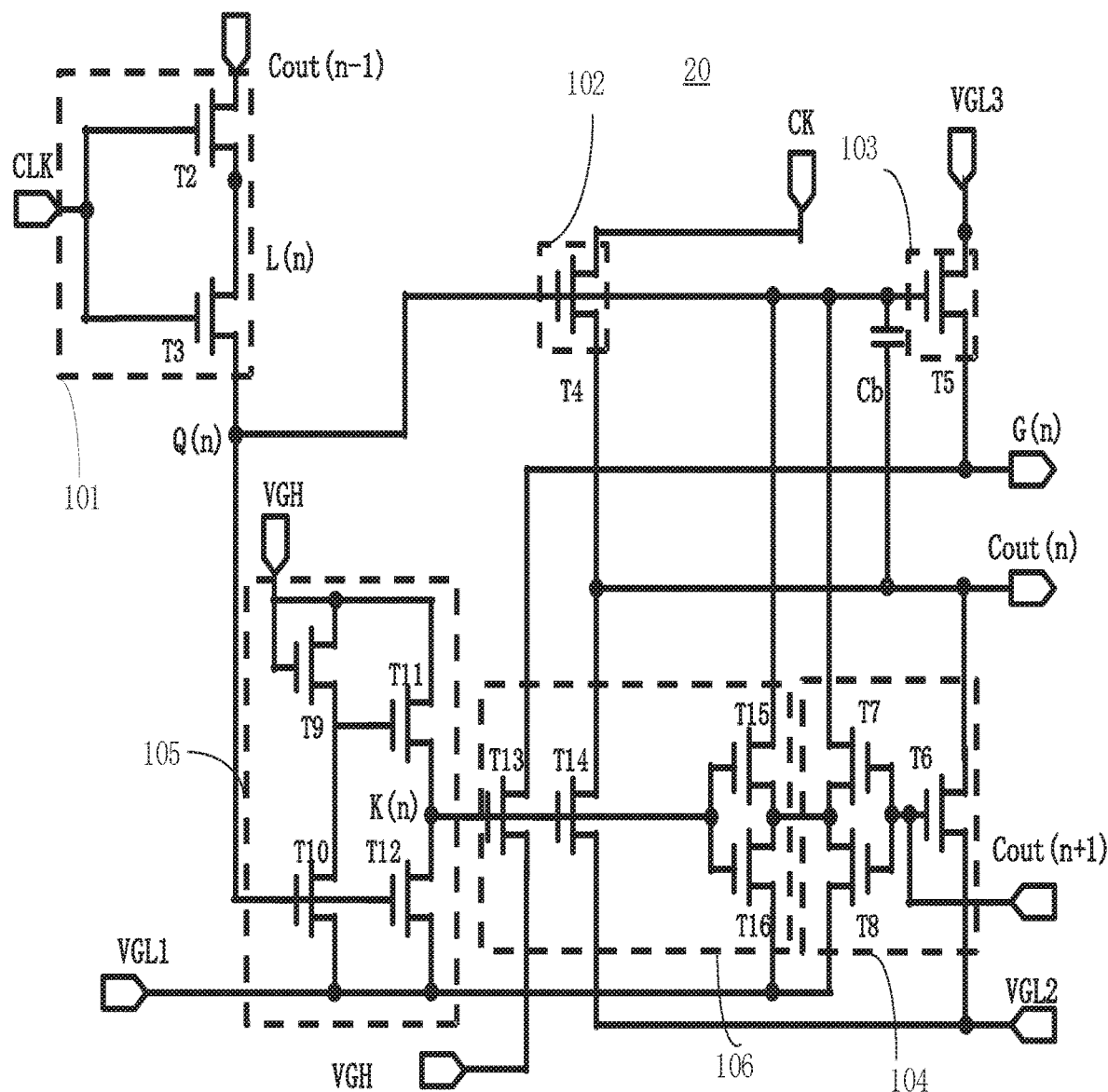
FIG. 2 is a schematic view showing a first circuit of a GOA unit in a GOA circuit of an embodiment of the invention.

Further, please refer to FIG. 2, where FIG. 2 is a schematic view showing a first circuit of a GOA unit in a GOA circuit of an embodiment of the invention. As shown in FIG. 2, the GOA circuit includes an input module 101, a first output module 102, a second output module 103, a pull-down module 104, an inversion module 105, a clamping module 106, and a bootstrap capacitor Cb.

The input module 101 is fed with a first clock signal CLK and a prior stage transmitted signal Cout(n−1), and is electrically connected to a first node Q(n) and a second node L(n). The input module 101 outputs the prior stage transmitted signal Cout(n−1) to the first node Q(n) under control of the first clock signal CLK.

The first output module 102 is fed with a second clock signal CK and is electrically connected to the first node Q(n). The first output module 102 outputs a current stage transmitted signal Cout(n) under control by voltage level of the first node Q(n).

The second output module 103 is fed with a third reference low voltage signal VGL3 and is electrically connected to the first node Q(n). The second output module 102 outputs a current stage scanning signal G(n) under control by voltage level of the first node Q(n).

The pull-down module 104 is fed with a next stage transmitted signal Cout(n+1), a first reference low level signal VGL1 and a second reference low level signal VGL2, and is electrically connected with the first node Q(n) and the current stage transmitted signal Cout(n). The pull-down module 104 pulls the voltage level of the first node Q(n) down to the voltage level of the first reference low level signal VGL1, and pull the voltage level of the current stage transmitted signal Cout(n) down to the second reference low level signal VGL2 under the control of the next stage transmitted signal Cout(n+1).

The inversion module 105 is fed with a reference high level signal VGH and the first reference low level signal VGL1, and is electrically connected to a third node K(n) and the first node Q(n). The inversion module 105 controls a voltage level of the third node K(n) according to the reference high level signal VGH, the first reference low level signal VGL1 and the voltage level of the first node Q(n).

The clamping module 106 is fed with the first reference low level signal VGL1, the reference high level signal VGH, and the second reference low level signal VGL2, and is electrically connected to the first node Q(n), the third node K(n), the current stage transmitted signal Cout(n) and the current stage scanning signal G(n). The clamping module 106 under control of the voltage level of the third node K(n), keeps the voltage level of the first node Q(n) and a voltage level of the current stage transmitted signal Cout(n) at a voltage level of the first reference low level signal VGL1, and a voltage level of the current stage scanning signal G(n) at a voltage level of the reference high level signal VGH.

One terminal of the bootstrap capacitor Cb is electrically connected to the first node Q(n), and the other terminal of the bootstrap capacitor Cb is electrically connected to the current stage transmitted signal Cout(n).

In some embodiments, the input module 101 comprises a second transistor T2 and a third transistor T3. A gate terminal of the second transistor T2 and a gate terminal of the third transistor T3 are electrically connected to the first clock signal CLK. A source terminal of the second transistor T2 is electrically connected to the prior stage transmitted signal Cout(n−1). A drain terminal of the second transistor T2 and a source terminal of the third transistor T3 are electrically connected with the second node L(n). A drain terminal of the third transistor T3 is electrically connected to the first node Q(n).

In some embodiments, the first output module 102 comprises a fourth transistor T4. A gate terminal of the fourth transistor T4 is electrically connected to the first node Q(n), a source terminal of the fourth transistor T4 is electrically connected to the second clock signal CK, and a drain terminal of the fourth transistor T4 is electrically connected to the current stage transmitted signal Cout(n).

In some embodiments, the second output module 103 comprises a fifth transistor T5. A gate terminal of the fifth transistor T5 is electrically connected to the first node Q(n), and a source terminal of the fifth transistor T5 is electrically connected to the third reference low voltage signal VGL3, and a drain terminal of the fifth transistor T4 is electrically connected to the current stage scanning signal G(n).

In some embodiments, the pull-down module 104 comprises a sixth transistor T6, a seventh transistor T7, and an eighth transistor T8. A gate terminal of the sixth transistor T6, a gate terminal of the seventh transistor T7, and a gate terminal of the eighth transistor T8 are electrically connected to the next stage transmitted signal Cout(n+1). A source terminal power of the sixth transistor T6 is electrically connected to the second reference low level signal VGL2. A drain terminal of the sixth transistor T6 is electrically connected to the current stage transmitted signal Cout (n). A drain terminal of the seventh transistor T7 is electrically connected to the first node Q(n). A source terminal of the seventh transistor T7 is connected with a drain terminal of the eighth transistor T8. A source terminal of the eighth transistor T8 is electrically connected to the first reference low level signal VGL1.

In some embodiments, the inversion module 105 comprises a ninth transistor T9, a tenth transistor T10, an eleventh transistor T11, and a $12^{th}$ transistor. A gate terminal and a source terminal of the ninth transistor T9 and a source polar of the eleventh transistor T11 are electrically connected to the reference high level signal VGH. A drain terminal of the ninth transistor T9 is electrically connected to a gate terminal of the eleventh transistor T11 and a drain terminal of the tenth transistor T10. A drain terminal of the eleventh transistor T11 and a drain terminal of the 12th transistor T12 are electrically connected to the third node K(n). A gate terminal of the tenth transistor T10 and a gate terminal of the 12th transistor T12 are electrically connected to the first node Q(n). A source terminal of the tenth transistor T10 and a source terminal of the 12th transistor T12 are electrically connected to the first reference low level signal VGL1.

In some embodiment, the clamping module 106 comprises a 13th transistor T13, a 14th transistor T14, a 15th transistor T15, and a 16th transistor T16. A gate terminal of the 13th transistor T13, a gate terminal of the 14th transistor T14, a gate terminal of the 15th transistor T15, and a gate terminal of the 16th transistor T16 are electrically connected to the third node K(n). A source terminal of the 13th transistor T13 is electrically connected to the reference high level signal VGH. A drain terminal of the 13th transistor T13 is electrically connected to the current stage scanning signal G(n). A source terminal of the 14th transistor T14 is electrically connected to the second reference low level signal VGL2. A drain terminal of the 14th transistor T14 is electrically connected to the current stage transmitted signal Cout(n). A drain terminal of the 16th transistor T16 is connected with a source terminal of the 15th transistor T15. A drain terminal of the 15th transistor T15 is electrically connected to the first node Q(n). A source terminal of the 16th transistor T16 is electrically connected to the first reference low level signal VGL1.

In some embodiments, the voltage level of the first reference low level signal VGL1 is lower than the voltage level of the second reference low level signal VGL2, and the voltage level of the second reference level signal is equal to the voltage level of the third reference low level signal.

Note that the current stage transmitted signal is a positive pulse signal, and the current stage scanning signal is a negative pulse signal. That is, the GOA provided in the embodiment of the application simultaneously outputs positive pulse waveform signals and negative pulse waveform signals.

Figure 3:
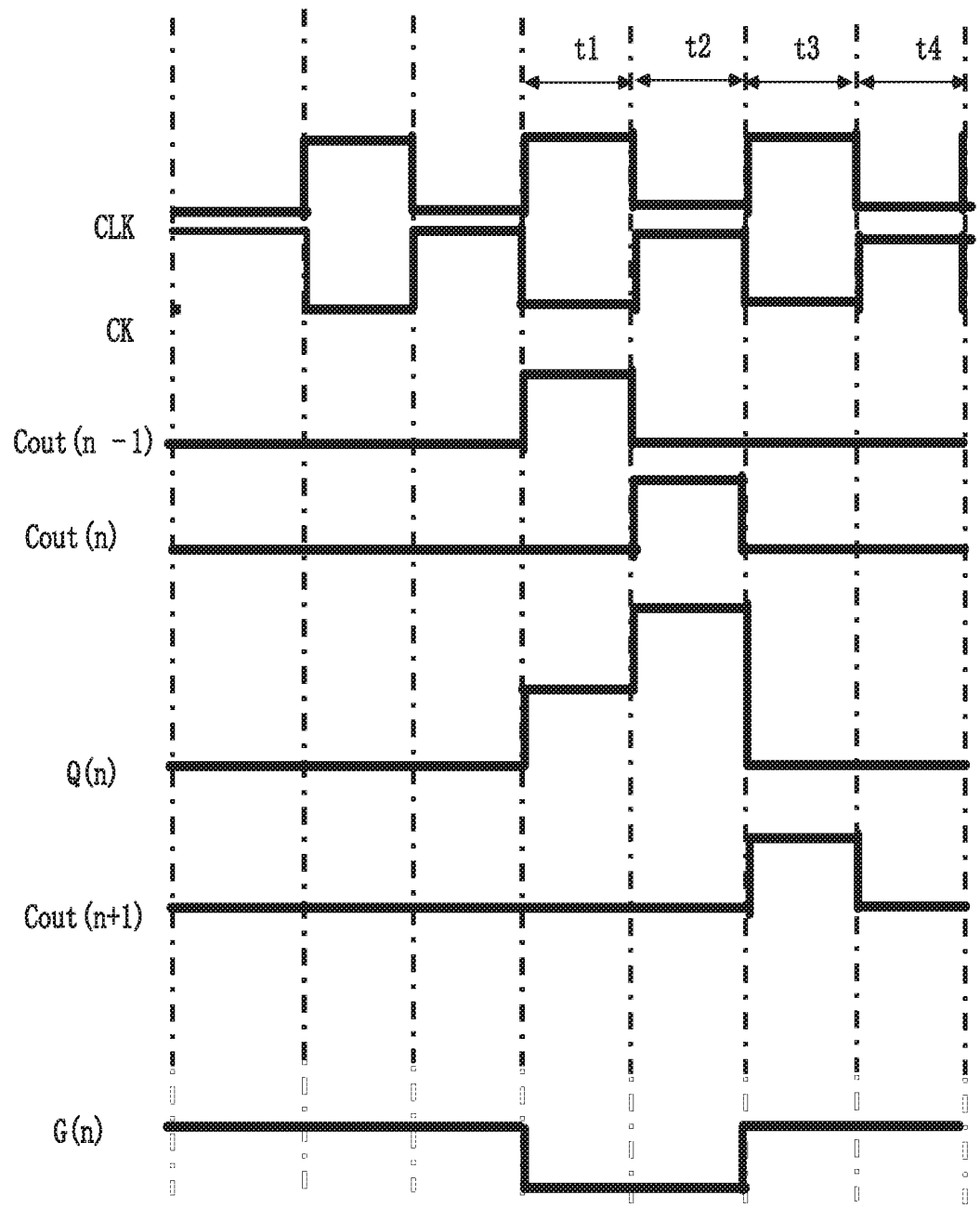
FIG. 3 is a signal timing sequence diagram of a GOA circuit of an embodiment of the invention.

In particular, please refer to FIGS. 2 and 3, where FIG. 3 is a signal timing sequence of a GOA circuit according to an embodiment of the application. A cycle of the first clock signal CLK is the same as that of the second clock signal CK while polarity of the first clock signal CLK is inversion of the polarity of the second clock signal CK. The voltage level of the first reference low level signal VGL1 is less than the voltage level of the second reference low level signal VGL2.

In the first time period t1, the first clock signal CLK is high, and the second transistor T2 and the third transistor T3 are ON. The prior stage transmitted signal Cout(n−1) input to the source pole of the second transistor T2 in this period is high, pulling up a voltage level of the first node Q(n), so that the fourth transistor T4 and the fifth transistor T5 open. At the same period, the second clock signal CK is low, so that the current stage transmitted signal Cout(n) is low. The voltage level of current stage scanning signal G(n) is equal to the third reference low level signal VGL3, that is, low.

In the second time period T2, the first clock signal CLK is low, the first transistor T1, the second transistor T2, and the third transistor T3 are OFF, the voltage level of the first node Q(n) continues to be high, and the fourth transistor T4 and the fifth transistor T5 is still ON. At the same period, the second clock signal CK is high, so that the current stage transmitted signal Cout(n) is high, the voltage level of the current stage scanning signal G(n) is still equal to the voltage level of the third reference low level signal VGL3, that is, low.

In the same period, at this stage, the voltage level of the current stage transmitted signal Cout(n) is high, the bootstrap capacitor Cb further pulls up the voltage level of the first node Q(n) to ensure the fourth transistor T4 and the fifth transistor T5 being ON, the current stage transmitted signal Cout(n) being high, and the current level scanning signal G(n) being low.

In the third time period t3, a voltage level of the next stage transmitted signal Cout(n+1) is high, so that the sixth transistor T6, the seventh transistor T7, and the eighth transistor T8 are ON and directly enable electrical conducting between the first node Q(n) and the first reference low level signal VGL1, and electrical conducting between the current stage transmitted signal Cout(n) and the second reference low level signal VGL2. That is, in this period, the voltage level of the current stage transmitted signal Cout(n) is pulled down to the voltage level of the second reference low level signal VGL2, and the voltage level of the first node Q(n) is pulled down to the voltage level of the first reference low level signal VGL1.

In the fourth time period t4, the voltage level of the first node Q (n) is low, the tenth transistor T10 and the 12th transistor T12 are OFF, and high level of the reference high level signal VGH is output to the second node L(n), so that the 13th transistor T13, the 14th transistor T14, the 15th transistor T15, and the 16th transistor T16 are ON. Accordingly, the voltage level of the first node Q(n) is kept at the voltage level of the first reference low level signal VGL1, and the voltage level of the current stage transmitted signal Cout(n) is kept at the voltage level of the second reference low level signal VGL2, and the voltage level of the current stage scanning signal G(n) is kept at the reference high level signal VGH.

Figure 4:
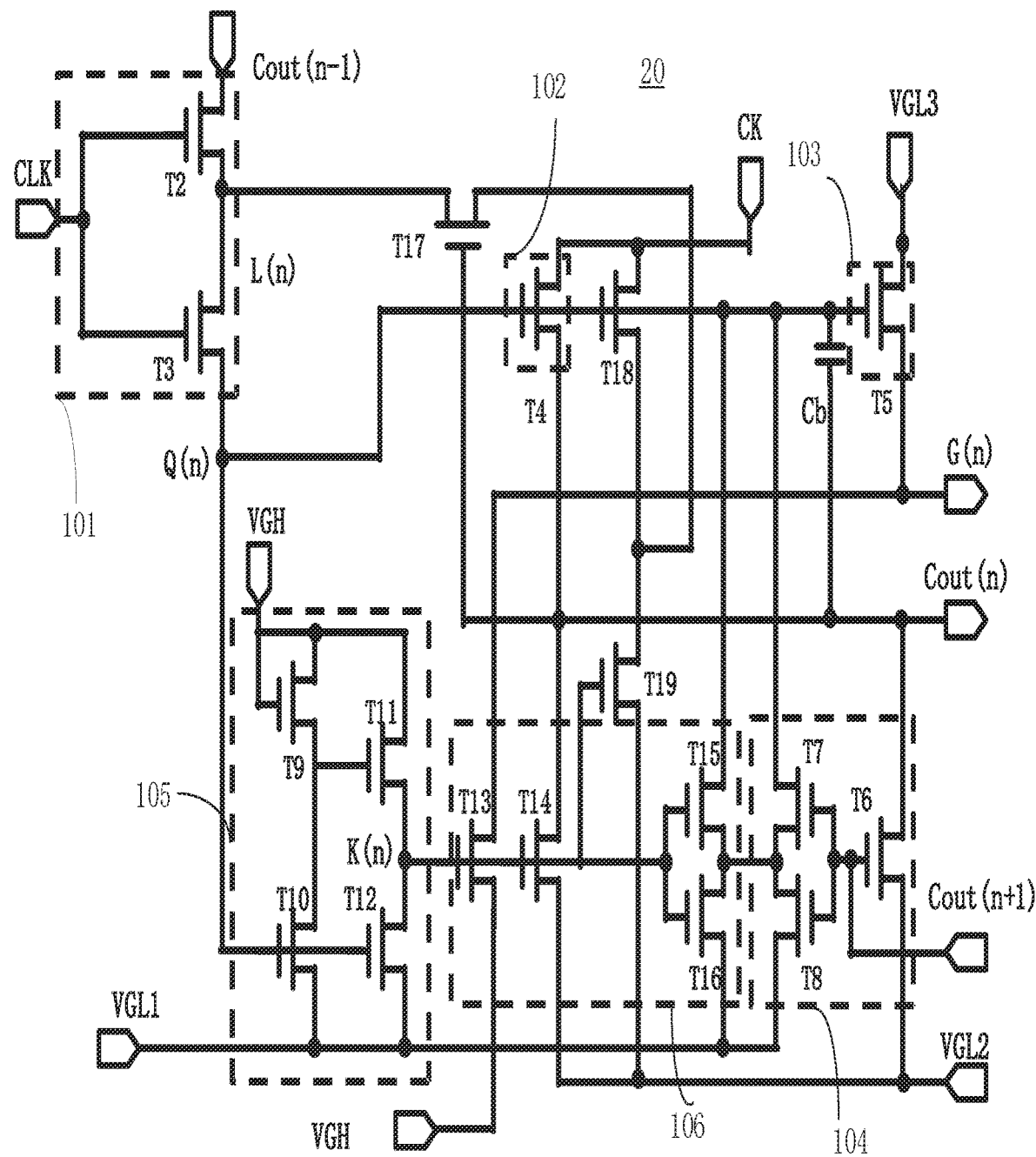
FIG. 4 is a schematic view showing a second circuit of a GOA unit in a GOA circuit of an embodiment of the invention.

Additionally, please refer to FIG. 4, where FIG. 4 is a second circuit diagram of a GOA unit in the GOA circuit of an embodiment of the application. The difference between the circuit shown in FIG. 4 and the circuit shown in FIG. 2 is that the GOA circuit in FIG. 4 further comprises a 17th transistor T17, an 18th transistor T18, and a 19th transistor T19.

A gate terminal of the 17th transistor T17 is electrically connected to the current stage transmitted signal Cout(n). A drain terminal of the 17th transistor T17 is electrically connected to the second node L(n), a source terminal of the 17th transistor T17 is electrically connected to a drain terminal of the 18th transistor T18 and a drain terminal of the 19th transistor T19. A gate terminal of the 18th transistor T18 is electrically connected to the first node Q(n). A source terminal of the 18th transistor T18 is electrically connected to the second clock signal CK. A gate terminal of the 19th transistor T19 is electrically connected to the third node K(n). A source terminal of the 19th transistor T19 is electrically connected to the second reference low level signal VGL2.

Note that the function of the GOA circuit is extended by adding the 17th transistor T17, the 18th transistor T18, and the 19th transistor T19, which make the GOA circuit more secure and stable.

Figure 5:
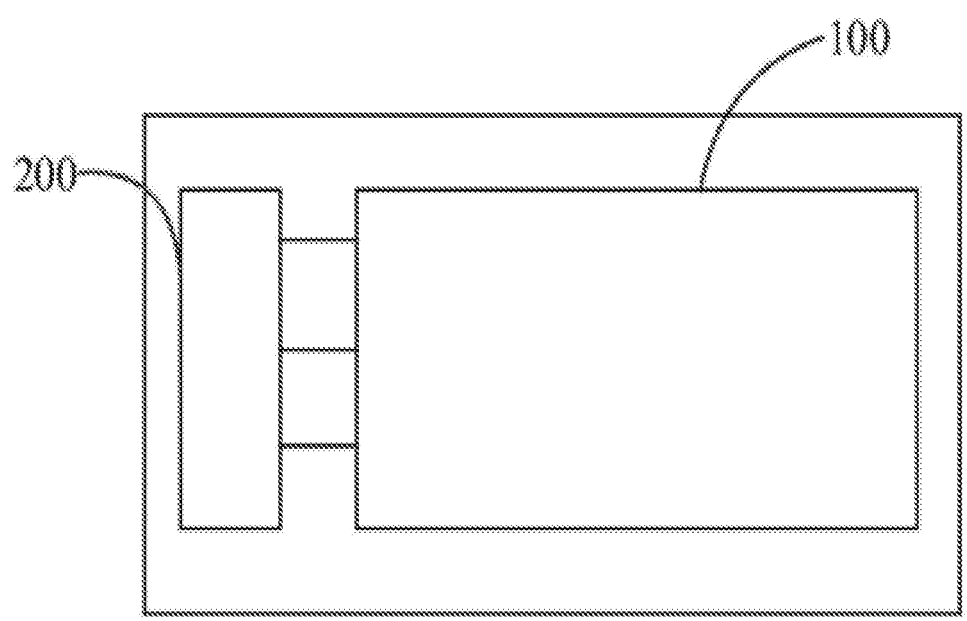
FIG. 5 is a schematic view showing architecture of a display apparatus of an embodiment of the invention.

See FIG. 5, where FIG. 5 is a schematic diagram of the display panel provided by the embodiment of this application. As shown in FIG. 5, the display panel includes a display area 100 and GOA circuit 200 located by an edge of the display area 100. The structure and operation principles of the GOA circuit are similar to the described GOA circuit and are not repeated here.

The above description is merely some embodiments of the present invention, which does not limit the scope of the invention. Any equivalent structure or process modification based on the specification and drawing of the invention, or any application of disclosure either directly or indirectly applied in other relevant technical fields, are included in the scope of claims of the invention.

What is claimed is:

1. A gate driver on array (GOA) circuit, comprising:
a multi-stage cascade of GOA units, each of which includes an input module, a first output module, a second output module, a pull-down module, an inversion module, a clamping module, and a bootstrap capacitor;
the input module is fed with a first clock signal and a prior stage transmitted signal, and is electrically connected to a first node and a second node, wherein the input module outputs the prior stage transmitted signal to the first node under control of the first clock signal;
the first output module is fed with a second clock signal and is electrically connected to the first node, wherein the first output module outputs a current stage transmitted signal under control by a voltage level of the first node;
the second output module is fed with a third reference low voltage signal and is electrically connected to the first node, wherein the second output module outputs a current stage scanning signal under control by the voltage level of the first node;
the pull-down module is fed with a next stage transmitted signal, a first reference low level signal and a second reference low level signal, and is electrically connected with the first node and the current stage transmitted signal, wherein the pull-down module pulls the voltage level of the first node down to the voltage level of the first reference low level signal, and pull the voltage level of the current stage transmitted signal down to the second reference low level signal under the control of the next stage transmitted signal;
the inversion module is fed with a reference high level signal and the first reference low level signal, and is electrically connected to a third node and the first node, wherein the inversion module controls a voltage level of the third node according to the reference high level signal, the first reference low level signal and the voltage level of the first node;
the clamping module is fed with the first reference low level signal, the reference high level signal, and the second reference low level signal, and is electrically connected to the first node, the third node, the current stage transmitted signal, and the current stage scanning signal, wherein the clamping module under control of the voltage level of the third node, keeps the voltage level of the first node and a voltage level of the current stage transmitted signal at a voltage level of the first reference low level signal, and a voltage level of the current stage scanning signal at a voltage level of the reference high level signal;
one terminal of the bootstrap capacitor is electrically connected to the first node, and the other terminal of the bootstrap capacitor is electrically connected to the current stage transmitted signal;
wherein the current stage transmitted signal is a positive pulse signal, and the current stage scanning signal is a negative pulse signal;
the GOA circuit further comprises a 17th transistor, an 18th transistor, and a 19th transistor;
a gate terminal of the 17th transistor is electrically connected to the current stage transmitted signal, and a drain terminal of the 17th transistor is electrically connected to the second node, a source terminal of the 17th transistor is electrically connected to a drain terminal of the 18th transistor and a drain terminal of the 19th transistor, a gate terminal of the 18th transistor is electrically connected to the first node, and a source terminal of the 18th transistor is electrically connected to the second clock signal, and a gate terminal of the 19th transistor is electrically connected to the third node, and a source terminal of the 19th transistor is electrically connected to the second reference low level signal;
the voltage level of the first reference low level signal is lower than the voltage level of the second reference low level signal, and the voltage level of the second reference level signal is equal to the voltage level of the third reference low level signal.

2. The GOA circuit of claim 1, wherein the input module comprises a second transistor and a third transistor, a gate terminal of the second transistor and a gate terminal of the third transistor are electrically connected to the first clock signal, and a source terminal of the second transistor is electrically connected to the prior stage transmitted signal, and a drain terminal of the second transistor and a source terminal of the third transistor are electrically connected with the second node, and a drain terminal of the third transistor is electrically connected to the first node.

3. The GOA circuit of claim 1, wherein the first output module comprises a fourth transistor, a gate terminal of the fourth transistor is electrically connected to the first node, and a source terminal of the fourth transistor is electrically connected to the second clock signal, and a drain terminal of the fourth transistor is electrically connected to the current stage transmitted signal.

4. The GOA circuit of claim 1, wherein the second output module comprises a fifth transistor, a gate terminal of the fifth transistor is electrically connected to the first node, and a source terminal of the fifth transistor is electrically connected to the third reference low voltage signal, and a drain terminal of the fifth transistor is electrically connected to the current stage scanning signal.

5. The GOA circuit of claim 1, wherein the pull-down module comprises a sixth transistor, a seventh transistor, and an eighth transistor, a gate terminal of the sixth transistor, a gate terminal of the seventh transistor, and a gate terminal of the eighth transistor are electrically connected to the next stage transmitted signal, and a source terminal power of the sixth transistor is electrically connected to the second reference low level signal, and a drain terminal of the sixth transistor is electrically connected to the current stage transmitted signal, a drain terminal of the seventh transistor is electrically connected to the first node, and a source terminal of the seventh transistor is connected with a drain terminal of the eighth transistor, and a source terminal of the eighth transistor is electrically connected to the first reference low level signal.

6. The GOA circuit of claim 1, wherein the inversion module comprises a ninth transistor, a tenth transistor, an eleventh transistor, and a 12th transistor, a gate terminal and a source terminal of the ninth transistor and a source polar of the eleventh transistor are electrically connected to the reference high level signal, a drain terminal of the ninth transistor is electrically connected to a gate terminal of the eleventh transistor and a drain terminal of the tenth transistor, a drain terminal of the eleventh transistor and a drain terminal of the 12th transistor are electrically connected to the third node, and a gate terminal of the tenth transistor and a gate terminal of the 12th transistor are electrically connected to the first node, a source terminal of the tenth transistor and a source terminal of the 12th transistor are electrically connected to the first reference low level signal.

7. The GOA circuit of claim 1, wherein the clamping module comprises a $13^{th}$ transistor, a 14th transistor, a $15^{th}$ transistor, and a 16th transistor, a gate terminal of the 13th transistor, a gate terminal of the 14th transistor, a gate terminal of the 15th transistor, and a gate terminal of the 16th transistor are electrically connected to the third node, and a source terminal of the 13th transistor is electrically connected to the reference high level signal, a drain terminal of the 13th transistor is electrically connected to the current stage scanning signal, and a source terminal of the 14th transistor is electrically connected to the second reference low level signal, a drain terminal of the 14th transistor is electrically connected to the current stage transmitted signal, and a drain terminal of the 16th transistor is connected with a source terminal of the 15th transistor, a drain terminal of the 15th transistor is electrically connected to the first node, and a source terminal of the 16th transistor is electrically connected to the first reference low level signal.

8. A gate driver on array (GOA) circuit, comprising:
a multi-stage cascade of GOA units, each of which includes an input module, a first output module, a second output module, a pull-down module, an inversion module, a clamping module, and a bootstrap capacitor;
the input module is fed with a first clock signal and a prior stage transmitted signal, and is electrically connected to a first node and a second node, wherein the input module outputs the prior stage transmitted signal to the first node under control of the first clock signal;
the first output module is fed with a second clock signal and is electrically connected to the first node, wherein the first output module outputs a current stage transmitted signal under control by voltage level of the first node;
the second output module is fed with a third reference low voltage signal and is electrically connected to the first node, wherein the second output module outputs a current stage scanning signal under control by voltage level of the first node;
the pull-down module is fed with a next stage transmitted signal, a first reference low level signal and a second reference low level signal, and is electrically connected with the first node and the current stage transmitted signal, wherein the pull-down module pulls the voltage level of the first node down to the voltage level of the first reference low level signal, and pull the voltage level of the current stage transmitted signal down to the second reference low level signal under the control of the next stage transmitted signal;
the inversion module is fed with a reference high level signal and the first reference low level signal, and is electrically connected to a third node and the first node, wherein the inversion module controls a voltage level of the third node according to the reference high level signal, the first reference low level signal and the voltage level of the first node;
the clamping module is fed with the first reference low level signal, the reference high level signal, and the second reference low level signal, and is electrically connected to the first node, the third node, the current stage transmitted signal, and the current stage scanning signal, wherein the clamping module under control of the voltage level of the third node, keeps the voltage level of the first node and a voltage level of the current stage transmitted signal at a voltage level of the first reference low level signal, and a voltage level of the current stage scanning signal at a voltage level of the reference high level signal;
one terminal of the bootstrap capacitor is electrically connected to the first node, and the other terminal of the bootstrap capacitor is electrically connected to the current stage transmitted signal;
wherein the current stage transmitted signal is a positive pulse signal, and the current stage scanning signal is a negative pulse signal.

9. The GOA circuit of claim 8, wherein the input module comprises a second transistor and a third transistor, a gate terminal of the second transistor and a gate terminal of the third transistor are electrically connected to the first clock signal, and a source terminal of the second transistor is electrically connected to the prior stage transmitted signal, and a drain terminal of the second transistor and a source terminal of the third transistor are electrically connected with the second node, and a drain terminal of the third transistor is electrically connected to the first node.

10. The GOA circuit of claim 8, wherein the first output module comprises a fourth transistor, a gate terminal of the fourth transistor is electrically connected to the first node, and a source terminal of the fourth transistor is electrically connected to the second clock signal, and a drain terminal of the fourth transistor is electrically connected to the current stage transmitted signal.

11. The GOA circuit of claim 8, wherein the second output module comprises a fifth transistor, a gate terminal of the fifth transistor is electrically connected to the first node, and a source terminal of the fifth transistor is electrically connected to the third reference low voltage signal, and a drain terminal of the fifth transistor is electrically connected to the current stage scanning signal.

12. The GOA circuit of claim 8, wherein the pull-down module comprises a sixth transistor, a seventh transistor and an eighth transistor, a gate terminal of the sixth transistor, a gate terminal of the seventh transistor and a gate terminal of the eighth transistor are electrically connected to the next stage transmitted signal, and a source terminal power of the sixth transistor is electrically connected to the second reference low level signal, and a drain terminal of the sixth transistor is electrically connected to the current stage transmitted signal, a drain terminal of the seventh transistor is electrically connected to the first node, and a source terminal of the seventh transistor is connected with a drain terminal of the eighth transistor, and a source terminal of the eighth transistor is electrically connected to the first reference low level signal.

13. The GOA circuit of claim 8, wherein the inversion module comprises a ninth transistor, a tenth transistor, an eleventh transistor, and a 12th transistor, a gate terminal and a source terminal of the ninth transistor and a source polar of the eleventh transistor are electrically connected to the reference high level signal, a drain terminal of the ninth transistor is electrically connected to a gate terminal of the eleventh transistor and a drain terminal of the tenth transistor, a drain terminal of the eleventh transistor and a drain terminal of the 12th transistor are electrically connected to the third node, and a gate terminal of the tenth transistor and a gate terminal of the 12th transistor are electrically connected to the first node, a source terminal of the tenth transistor and a source terminal of the 12th transistor are electrically connected to the first reference low level signal.

14. The GOA circuit of claim 8, wherein the clamping module comprises a 13th transistor, a 14th transistor, a 15th transistor, and a 16th transistor, a gate terminal of the 13th transistor, a gate terminal of the 14th transistor, a gate terminal of the 15th transistor, and a gate terminal of the 16th transistor are electrically connected to the third node, and a source terminal of the 13th transistor is electrically connected to the reference high level signal, a drain terminal of the 13th transistor is electrically connected to the current stage scanning signal, and a source terminal of the 14th transistor is electrically connected to the second reference low level signal, a drain terminal of the 14th transistor is electrically connected to the current stage transmitted signal, and a drain terminal of the 16th transistor is connected with a source terminal of the 15th transistor, a drain terminal of the 15th transistor is electrically connected to the first node, and a source terminal of the 16th transistor is electrically connected to the first reference low level signal.

15. The GOA circuit of claim 8, wherein the GOA circuit further comprises: a 17th transistor, an 18th transistor, and a 19th transistor, a gate terminal of the 17th transistor is electrically connected to the current stage transmitted signal, and a drain terminal of the 17th transistor is electrically connected to the second node, a source terminal of the 17th transistor is electrically connected to a drain terminal of the 18th transistor and a drain terminal of the 19th transistor, a gate terminal of the 18th transistor is electrically connected to the first node, and a source terminal of the 18th transistor is electrically connected to the second clock signal, and a gate terminal of the 19th transistor is electrically connected to the third node, and a source terminal of the 19th transistor is electrically connected to the second reference low level signal.

16. The GOA circuit of claim 8, wherein the voltage level of the first reference low level signal is lower than the voltage level of the second reference low level signal, and the voltage level of the second reference level signal is equal to the voltage level of the third reference low level signal.

17. A display apparatus, comprising:
a gate driver on array (GOA) circuit, wherein the GOA circuit comprises:
a multi-stage cascade of GOA units, each of which includes an input module, a first output module, a second output module, a pull-down module, an inversion module, a clamping module, and a bootstrap capacitor;
the input module is fed with a first clock signal and a prior stage transmitted signal, and is electrically connected to a first node and a second node, wherein the input module outputs the prior stage transmitted signal to the first node under control of the first clock signal;
the first output module is fed with a second clock signal and is electrically connected to the first node, wherein the first output module outputs a current stage transmitted signal under control by a voltage level of the first node;
the second output module is fed with a third reference low voltage signal and is electrically connected to the first node, wherein the second output module outputs a current stage scanning signal under control by the voltage level of the first node;
the pull-down module is fed with a next stage transmitted signal, a first reference low level signal and a second reference low level signal, and is electrically connected with the first node and the current stage transmitted signal, wherein the pull-down module pulls the voltage level of the first node down to the voltage level of the first reference low level signal, and pull the voltage level of the current stage transmitted signal down to the second reference low level signal under the control of the next stage transmitted signal;
the inversion module is fed with a reference high level signal and the first reference low level signal, and is electrically connected to a third node and the first node, wherein the inversion module controls a voltage level of the third node according to the reference high level signal, the first reference low level signal and the voltage level of the first node;
the clamping module is fed with the first reference low level signal, the reference high level signal, and the second reference low level signal, and is electrically connected to the first node, the third node, the current stage transmitted signal, and the current stage scanning signal, wherein the clamping module under control of the voltage level of the third node, keeps the voltage level of the first node and a voltage level of the current stage transmitted signal at a voltage level of the first reference low level signal, and a voltage level of the current stage scanning signal at a voltage level of the reference high level signal;

one terminal of the bootstrap capacitor is electrically connected to the first node, and the other terminal of the bootstrap capacitor is electrically connected to the current stage transmitted signal;

wherein the current stage transmitted signal is a positive pulse signal, and the current stage scanning signal is a negative pulse signal.

18. A display apparatus of claim 17, wherein the input module comprises a second transistor and a third transistor, a gate terminal of the second transistor and a gate terminal of the third transistor are electrically connected to the first clock signal, and a source terminal of the second transistor is electrically connected to the prior stage transmitted signal, and a drain terminal of the second transistor and a source terminal of the third transistor are electrically connected with the second node, and a drain terminal of the third transistor is electrically connected to the first node.

19. The display apparatus of claim 17, wherein the first output module comprises a fourth transistor, a gate terminal of the fourth transistor is electrically connected to the first node, and a source terminal of the fourth transistor is electrically connected to the second clock signal, and a drain terminal of the fourth transistor is electrically connected to the current stage transmitted signal.

20. The display apparatus of claim 17, wherein the second output module comprises a fifth transistor, a gate terminal of the fifth transistor is electrically connected to the first node, and a source terminal of the fifth transistor is electrically connected to the third reference low voltage signal, and a drain terminal of the fourth transistor is electrically connected to the current stage scanning signal.

* * * * *